United States Patent
DuPré et al.

[19]

[11] Patent Number: 5,880,925
[45] Date of Patent: Mar. 9, 1999

[54] SURFACE MOUNT MULTILAYER CAPACITOR

[75] Inventors: David A. DuPré ; John L. Galvagni; Andrew P. Ritter, all of Surfside Beach, S.C.

[73] Assignee: AVX Corporation, Myrtle Beach, S.C.

[21] Appl. No.: 884,597

[22] Filed: Jun. 27, 1997

[51] Int. Cl.$^6$ .......................... H01G 4/005; H01G 4/228; H01G 4/06
[52] U.S. Cl. ................... 361/303; 361/306.1; 361/308.1; 361/313; 361/321.2
[58] Field of Search .................................. 361/303–305, 361/306.1–306.3, 308.1, 310–313, 321.1, 321.5, 301.4, 309, 322, 329

[56] References Cited

U.S. PATENT DOCUMENTS

| | | |
|---|---|---|
| 3,308,359 | 3/1967 | Hayworth et al. . |
| 3,612,963 | 10/1971 | Piper . |
| 3,822,397 | 7/1974 | Puppolo et al. . |
| 3,971,970 | 7/1976 | Voyles et al. . |
| 4,074,340 | 2/1978 | Leigh . |
| 4,274,124 | 6/1981 | Feinberg et al. . |
| 4,346,429 | 8/1982 | Dematos . |
| 4,419,714 | 12/1983 | Locke . |
| 4,430,690 | 2/1984 | Chance et al. . |
| 4,706,162 | 11/1987 | Hernandez et al. . |
| 4,814,940 | 3/1989 | Horstmann et al. . |
| 4,831,494 | 5/1989 | Arnold et al. . |
| 4,853,826 | 8/1989 | Hernandez . |
| 4,862,318 | 8/1989 | Galvagni et al. . |
| 5,517,385 | 5/1996 | Galvagni et al. . |

OTHER PUBLICATIONS

A paper entitled "Technical Information: Low Inductance Capacitors for Digital Circuits," by John Galvagni of AVX Corporation, Myrtle Beach, SC (No date provided).

A paper entitled "Technical Information: Advanced Decoupling Using Ceramic MLC Capacitors," by John D. Prymak of AVX Corporation, Olean, NY (No date provided).

Primary Examiner—Kristine Kincaid
Assistant Examiner—Anthony Dinkins
Attorney, Agent, or Firm—Dority & Manning, P.A.

[57] ABSTRACT

A multilayer ceramic device suitable for use in surface mount decoupling applications may have a single capacitor or a capacitor array. The device has a capacitor body defining a plurality of electrical terminals on an outer surface thereof. The terminals are interdigitated such that a respective first polarity terminal will be adjacent to a respective second polarity terminal (and vice versa). The capacitor body contains a plurality of interleaved capacitor plates in opposed and spaced apart relation. Capacitor plates of the first polarity are electrically connected to respective first polarity terminals via a plurality of lead structures. Likewise, a plurality of lead structures electrically connect capacitor plates of the second polarity to respective second polarity terminals.

30 Claims, 5 Drawing Sheets

SURFACE MOUNT MULTILAYER CAPACITOR

BACKGROUND OF THE INVENTION

The present invention relates generally to the art of multilayer capacitors. In a particular aspect, the present invention relates to an improved multilayer ceramic capacitor (MLC) suitable for use as a surface mount decoupling capacitor.

Various electronic equipment will often utilize decoupling capacitors electrically connected between semiconductor chips and their associated power supply. These capacitors function as a reservoir of energy during transients caused by switching within the semiconductor chip. While typically located near the chips, decoupling capacitors are often separate capacitor devices. For various reasons, surface-mount compatible MLCs have seen widespread use for this purpose.

MLCs are generally constructed having a plurality of ceramic-electrode layers arranged in a stack. During manufacture, the stacked ceramic-electrode layers are pressed and sintered to achieve a substantially unitary capacitor body. The capacitor body is often rectangular in shape, with electrical terminals of opposite polarity provided along respective sides or at opposite ends.

SUMMARY OF THE INVENTION

The present invention recognizes various disadvantages of prior art constructions and methods. Accordingly, it is an object of the present invention to provide an improved capacitor device.

It is more particular object of the present invention to provide an improved multilayer ceramic capacitor.

It is a specific object of the present invention to provide an improved surface mount compatible decoupling capacitor for use in electronic equipment.

It is also an object of the present invention to provide a novel capacitor array structure.

Some of these objects are achieved by a multilayer capacitor device suitable for use as a surface mount decoupling capacitor. The capacitor device comprises a capacitor body including a plurality of first and second electrode plates interleaved in opposed and spaced apart relation. The capacitor body is low-aspect, and may have an aspect ratio of less than about 0.5:1. A dielectric material located between each opposing set of electrode plates provides a predetermined dielectric constant.

The first and second electrode plates each include a main electrode portion and a plurality of spaced apart lead structures extending therefrom. Respective lead structures of the first electrode plates are located adjacent respective lead structures of the second electrode plates in an interdigitated arrangement.

Corresponding lead structures of respective first electrode plates are electrically connected together. Likewise, corresponding lead structures of respective second electrode plates are also electrically connected together. This construction thus defines a plurality of electrical terminals of a first polarity and a plurality of electrical terminals of a second polarity. The electrical terminals may be formed by a thick-film terminal material.

Each lateral side of the main electrode portions may have an equal number of lead structures extending therefrom. In an exemplary construction, each lateral side has a total of two lead structures extending therefrom. In such embodiments, respective lead structures extending from one of the lateral sides may be offset by one terminal position in relation to respective lead structures extending from the opposite lateral side. In addition, a first single lead structure may extend from an end of the main electrode portion of the first electrode plates and a second single lead structure may extend from the main electrode portion of the second electrode plate.

Other objects of the present invention are achieved by an electrical circuit arrangement comprising a generally planar circuit board having a plurality of electrical current paths defined thereon. The arrangement further includes a capacitor device having a capacitor body surface mounted on the circuit board. Electrical terminals of the capacitor body are in respective electrical communication with predetermined of the current paths.

The capacitor body includes at least one first electrode plate and at least one second electrode plate situated in opposed and spaced apart relation, the electrode plates being situated in a plane substantially parallel to a plane of the circuit board. The first electrode plate has a generally rectangular first main electrode portion with a plurality of first lead structures extending therefrom. Similarly, the second electrode plate has a generally rectangular second main electrode portion with a plurality of second lead structures extending therefrom. Respective of the first lead structures are located adjacent respective of the second lead structures in an interdigitated arrangement. A ceramic material is located between each opposing set of first and second electrode plates to provide a predetermined dielectric constant.

The electrical terminals may be located on at least one lateral side of the capacitor body. For example, the electrical terminals may be located on both lateral sides of the capacitor body. Preferably, the electrical terminals are electrically connected to current paths utilizing eutectic solder.

Each lateral side of the first main electrode portions may have an equal number of the first lead structures. Likewise, each lateral side of the second main electrode portions may also have an equal number of the second lead structures. First and second lead structures located on opposite lateral sides of the respective first and second main electrode portion may be offset by one terminal position in relation to each other.

In presently preferred embodiments, the capacitor body has an aspect ratio of no more than approximately 1:1. The capacitor body may, for example, have an aspect ratio of no more than approximately 0.5:1.

Still further objects of the present invention are achieved by a multilayer ceramic capacitor comprising a capacitor body having a low aspect ratio, such as an aspect ratio of no more than 0.5:1. The capacitor body is constructed having a unitary structure characteristic of a plurality of stacked, pressed and sintered ceramic-electrode layers. A plurality of first polarity electrical terminals and a plurality of second polarity electrical terminals are located on the outer surface of the capacitor body. The terminals are formed by a thick-film terminal material.

Each ceramic-electrode layer includes an electrode plate having a main electrode portion with a plurality of lead structures extending therefrom. The electrode plates are interleaved such that respective lead structures of first alternating electrode plates are electrically connected to first polarity terminals and respective lead structures of second alternating electrode plates are electrically connected to second polarity terminals. The capacitor is constructed and arranged to exhibit an inductance of less than approximately 100 picohenries.

In some presently preferred embodiments, respective lead structures of the first alternating electrode plates are located adjacent to respective lead structures of the second alternating electrode plates in an interdigitated arrangement. In such embodiments, the capacitor body may have a generally rectangular configuration defining lateral sides of greater dimension and end sides of lesser dimension. Respective lateral sides may each have an equal number of first polarity terminals and second polarity terminals. For example, each lateral side may have two first polarity terminals and two second polarity terminals.

Still further objects of the invention are achieved by a capacitor array having a plurality of capacitor devices in a surface mount compatible package. The array comprises a capacitor body having a unitary structure characteristic of a plurality of stacked, pressed and sintered ceramic-electrode layers. The ceramic electrode layers comprise a plurality of first ceramic-electrode layers and a plurality of second ceramic-electrode layers. The capacitor body further includes a plurality of first polarity electrical terminals and a plurality of second polarity electrical terminals located on the outer surface thereof.

The first ceramic-electrode layers each include an electrode plate having a first main electrode portion with a plurality of first lead structures extending therefrom. The second ceramic-electrode layers each include a plurality of coplanar second electrode plates situated in opposed and spaced apart relation to the first electrode plate. The second electrode plates each have a second main electrode portion with at least one second lead structure extending therefrom.

Respective first lead structures are located adjacent to respective second lead structures in an interdigitated arrangement. Each of the lead structures extends to respective electrical terminals such that the capacitor array has a number of capacitor devices equal to a number of the second electrode plates.

Other objects, features and aspects of the present invention are provided by various combinations and subcombinations of the disclosed elements, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
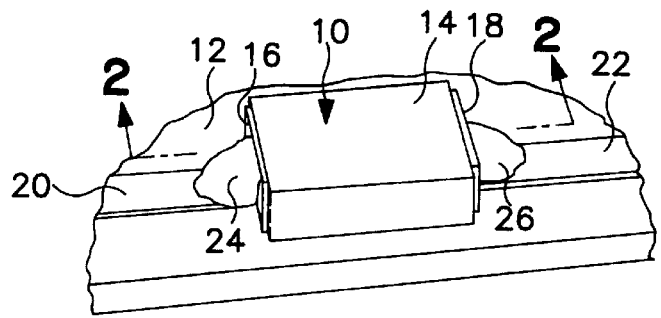
FIG. 1 is a perspective view of a prior art MLC device in position on a printed circuit board.

Repeat use of reference characters in the present specification and drawings is intended to represent same or analogous features or elements of the invention.

DETAILED DESCRIPTION OF PREFERRED EMBODIMENTS

It is to be understood by one of skill in the art that the present discussion is a description of exemplary embodiments only, and is not intended as limiting the broader aspects of the present invention, which broader aspects are embodied in the exemplary constructions.

In order to place the teachings of the present invention in context, prior art related to surface-mount decoupling capacitors will now be discussed in greater detail. Thus, FIG. 1 illustrates a prior art MLC device 10 mounted to a printed circuit board 12. Device 10 includes a capacitor body 14 having terminals 16 and 18 of opposite polarity located at the respective ends thereof. Terminals 16 and 18 are typically formed as thick film terminals in a manner known in the art.

Terminals 16 and 18 are electrically connected to respective conductive paths 20 and 22 defined on the surface of printed circuit board 12. Electrical connection between each terminal and its associated conductive path may be effected by respective solder beads 24 and 26. Typically, circuit board 12 may be made from a low-temperature organic material, with the solder being a low temperature eutectic solder applied by wave or reflow soldering techniques.

The external dimensions of an MLC will often be very small in relation to other types of capacitors. According to industry practice, the size of device 10 is generally expressed as a number "XXYY," with XX and YY being the width or length in hundredths of an inch. The side, i.e, width or length, to which the terminals are applied is XX, with YY expressing the other dimension. Some typical sizes of capacitor body 14 under this practice are 0612, 1012, 0508, 0306 and 1218. In addition, capacitor body 14 will typically have a low aspect ratio, defined as the ratio of the height to the longer of the width or the length. Aspect ratios of less than 1:1, and often less than 0.5:1, are not uncommon.

Figure 2:
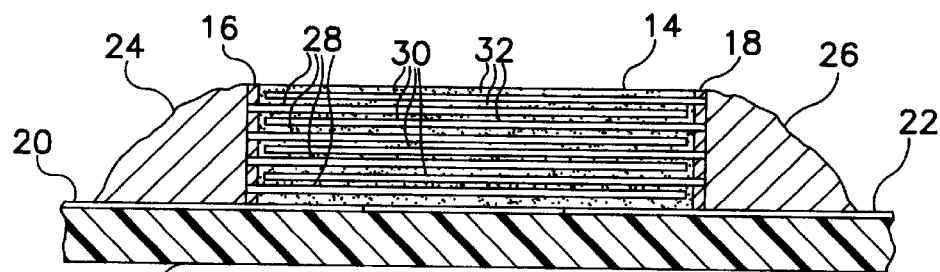
FIG. 2 is a cross sectional view of the prior art MLC device of FIG. 1 as taken along line 2—2.

Referring now to FIG. 2, the internal construction of capacitor body 14 will be explained. As can be seen, capacitor body 14 includes a plurality of first electrode plates 28 interleaved in opposed and spaced apart relation with a plurality of second electrode plates 30. The electrode plates are separated by layers (such as layers 32) of ceramic material to provide a predetermined dielectric constant. Capacitor body 14 is typically made by stacking ceramic-electrode layers formed using conventional dicing techniques, which are then pressed and sintered in a kiln.

As shown, all of electrode plates 28 are electrically connected to terminal 16. In a similar manner, electrode plates 30 are electrically connected to terminal 18. As a result, device 10 functions as multiple two-plate capacitors arranged in parallel.

Figure 3:
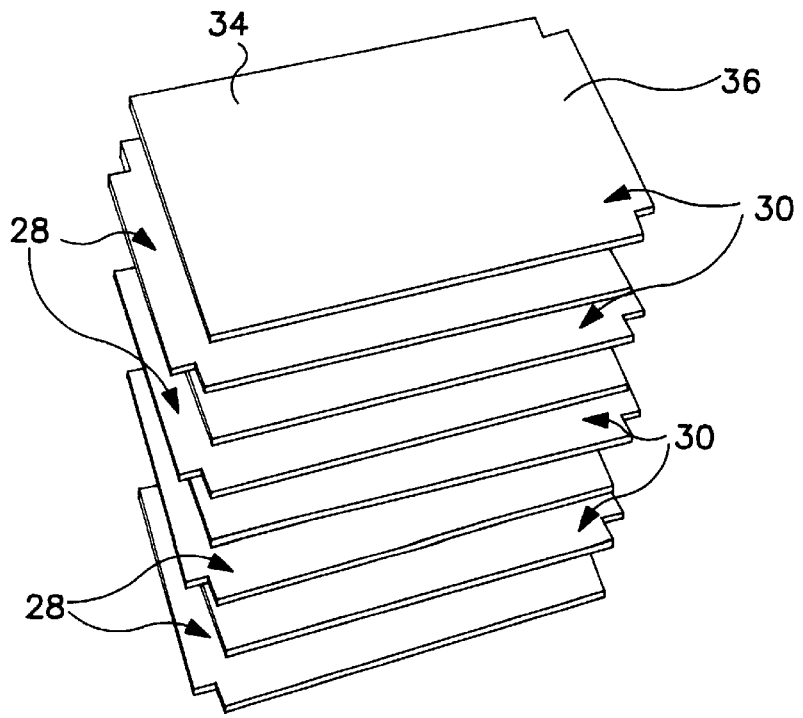
FIG. 3 is an exploded perspective view of the plurality of electrode plates utilized in the prior art MLC device of FIG. 1.

The specific configuration of electrode plates 28 and 30 is readily apparent in FIG. 3. Electrode plates 30 each include a main electrode portion 34 and a tab portion 36. Tab portion 36 functions as a lead structure to provide the desired electrical connection with terminal 18. Electrode plates 28 are similarly constructed, except that the tab portion extends from the opposite end of the main electrode portion to provide electrical connection with terminal 16.

Various devices of the present invention will now be discussed with reference to the remaining figures. In many cases, these devices may be utilized in lieu of the prior art devices as described above. Thus, it will often be desirable that external dimensions, aspect ratios and the like remain as similar to the prior art as practicable.

Figure 4:
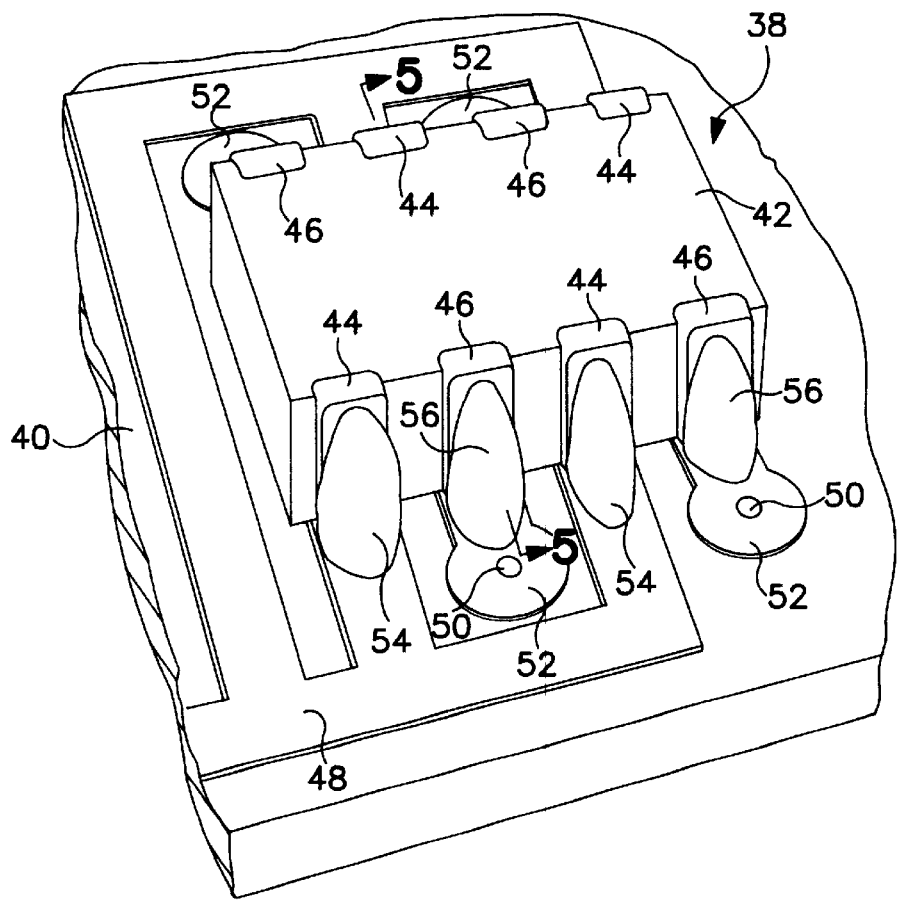
FIG. 4 is a perspective view of a MLC device constructed in accordance with the present invention in position on a printed circuit board.

FIG. 4 illustrates a MLC device 38 mounted to a printed circuit board 40. Device 38 includes a capacitor body 42 having a plurality of first polarity terminals 44 and a plurality of second polarity terminals 46. In this case, each lateral side of capacitor body 42 includes a pair of first polarity terminals 44 and a pair of second polarity terminals 46. Terminals 44 and 46 are typically produced using thick film application techniques.

As can be seen, the opposite polarity terminals located on each lateral side of capacitor body 42 are interdigitated such that a first polarity terminal 44 will always be adjacent at least one second polarity terminal 46 (and vice versa). In addition, terminals of like polarity located on opposite lateral sides of capacitor body 42 are offset by one terminal position. Thus, a first polarity terminal 44 on one lateral side of capacitor body 42 will be situated across from a second polarity terminal 46 located on the opposite lateral side.

In this case, a conductive path 48 may be defined on the top surface of printed circuit board 40 so that terminals 44 will be electrically connected to one another. Terminals 46 are electrically connected to one another by a similar conductive path located on the bottom surface of printed circuit board 40. Vias 50 extend up through printed circuit board 40 to respective traces 52, which provide final connection to the respective terminals 46.

Respective solder beads 54 may be provided for terminals 44, with similar solder beads 56 being provided for each of terminals 46. In part because printed circuit board 40 will often be made from a low temperature organic material, solder beads 54 and 56 are preferably produced by a low temperature eutectic solder applied through wave or reflow soldering techniques.

Figure 5:
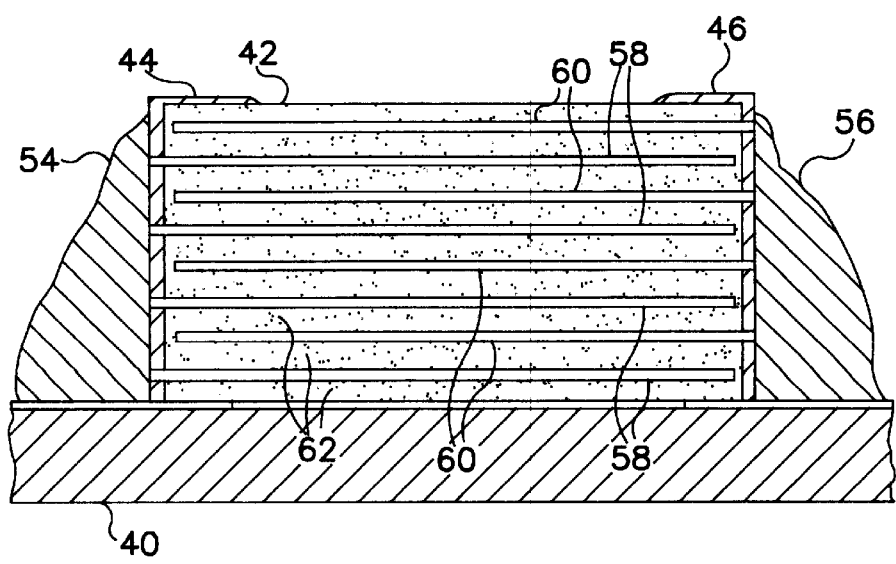
FIG. 5 is a cross sectional view of the MLC device of FIG. 4 as taken along line 5—5.

Referring now to FIG. 5, capacitor body 42 contains a plurality of first electrode plates 58 interleaved in opposed and spaced apart relation with a plurality of second electrode plates 60. Electrode plates 58 are electrically connected to each of terminals 44, whereas electrode plates 60 are electrically connected to terminals 46. Like prior art device 10, the electrode plates are preferably separated by layers of ceramic material, such as layers 62. Also similar to device 10, capacitor body 42 may be formed of stacked ceramic-electrode layers which are pressed and sintered in a kiln to yield a substantially unitary construction.

Figure 6:
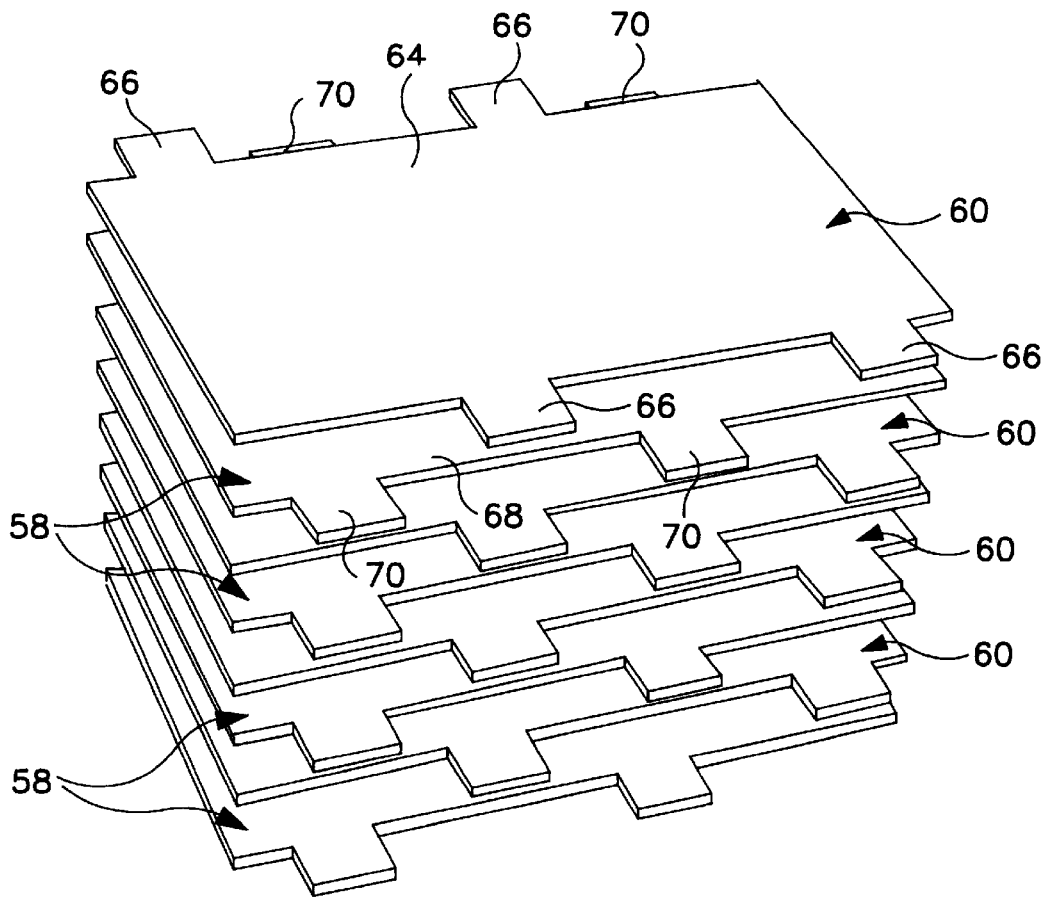
FIG. 6 is an exploded perspective view of the plurality of electrode plates utilized in the MLC device of FIG. 4.
Figure 7:
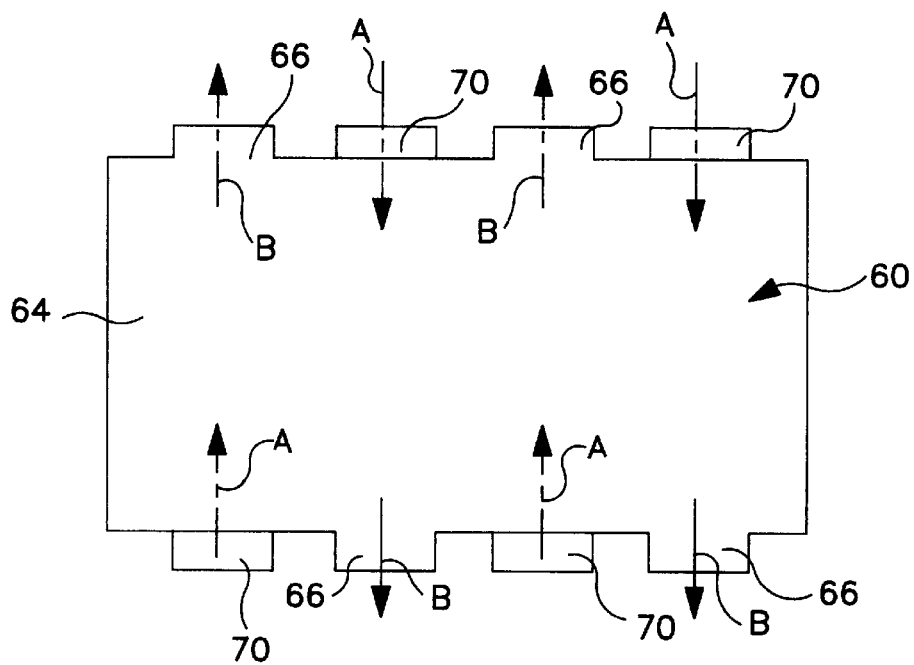
FIG. 7 is a plan view of a first electrode plate stacked above a second electrode plate as in the MLC device of FIG. 4 to illustrate the lead structure thereof.

The configuration of electrode plates 58 and 60 may be explained with reference to FIGS. 6 and 7. As can be seen, electrode plates 60 each include a main electrode portion 64 having a plurality of lead structures 66 extending therefrom. Each electrode plate 58 also has a main electrode portion 68 in register with main electrode portions 64. A plurality of lead structures 70 extend from each of the main electrode portions 68.

It will be appreciated that lead structures 66 connect to terminals 46, while lead structures 70 connect to terminals 44. Accordingly, respective lead structures 66 will be interdigitated with respective lead structures 70 in a manner similar to terminals 44 and 46. The interdigitated lead structures provide multiple, adjacent current injection points onto the associated main electrode portion. Current travelling in opposite directions, as indicated by arrows A and B of FIG. 7, will tend to cancel mutual inductance that could otherwise develop.

As a particular advantage of this arrangement, device 38 will generally have a very low inductance in comparison with device 10 of similar dimensions. For example, many embodiments of the present invention will exhibit an inductance of less than 100 picohenries. The offset nature of lead structures on opposite lateral sides of each electrode plate also reduces mutual inductance levels.

While additional lead structures may further reduce mutual inductance, each electrode plate of device 38 includes four lead structures for production and cost considerations. It is desirable, however, that adjacent lead structures remain in close proximity to facilitate field cancellation. For example, adjacent lead structures will often be no more than 0.03 inches apart.

Figure 8:
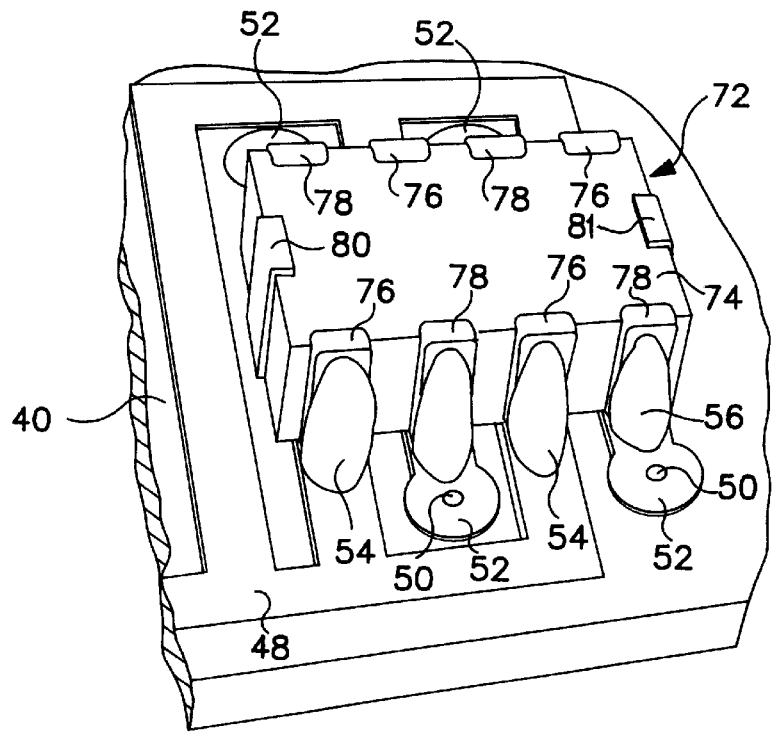
FIG. 8 is a view similar to FIG. 4 illustrating a first alternative embodiment of a MLC device constructed in accordance with the present invention.

FIG. 8 illustrates a MLC device 72 similar in construction to device 38. For example, MLC device 72 includes a capacitor body 74 having a plurality of first polarity terminals 76. Like device 38, device 72 includes a plurality of second polarity terminals 78 are interdigitated with terminals 76.

In addition, however, capacitor body 74 includes a first end terminal 80 and a second end terminal 81 of opposite polarity. While circuit board 40 may be adapted to permit connection of terminals 80 and 81 to the overall circuit, it has not been so adapted in the illustrated construction. Thus, terminals 80 and 81 remain unconnected to the current paths of circuit board 40 during use. Even in this case, however, terminals 80 and 81 are advantageous to permit testing of device 72 during manufacture with test equipment previously used to test prior art devices as shown in FIGS. 1–3.

Figures 9A, 9B:
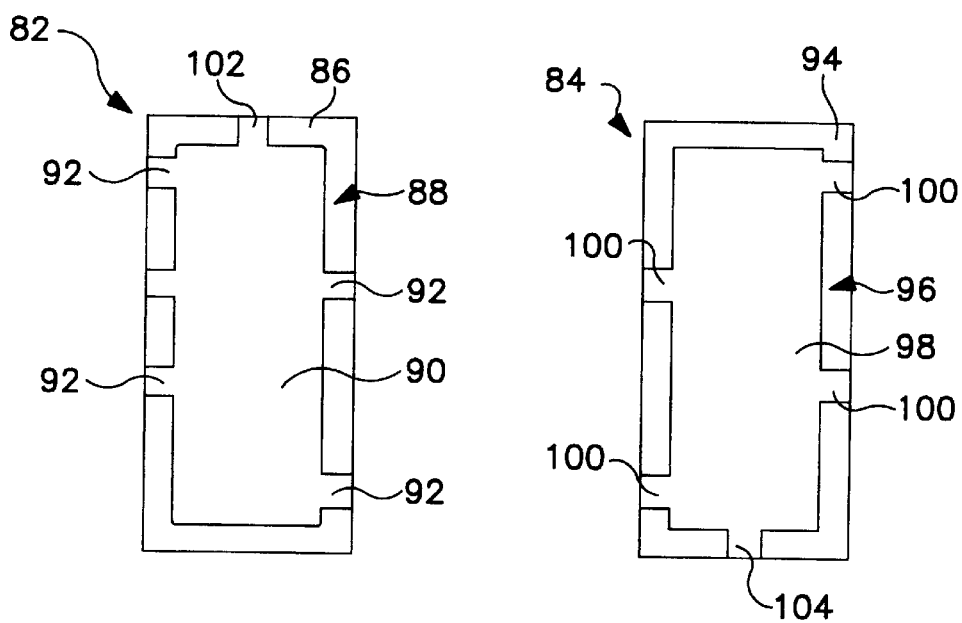
FIGS. 9A and 9B illustrate respective layers as may be stacked in the production of the MLC device of FIG. 8.

FIGS. 9A and 9B illustrate respective ceramic-electrode layers 82 and 84 that may be stacked in an interleaved arrangement in the production of MLC device 72. Layer 82 includes a ceramic substrate 86 having thereon a first electrode plate 88. Electrode plate 88 defines a main electrode portion 90 and a plurality of tab portions 92 extending from lateral sides thereof. Similarly, layer 84 includes a ceramic substrate 94 and a second electrode plate 96. Electrode plate 96 defines a main electrode portion 98 from which a plurality of tab portions 100 extend.

It will be appreciated that the structure of ceramic-electrode layers 82 and 84 as described thus far is similar to the ceramic-electrode layers from which MLC device 38 may be produced. In this case, however, main electrode portions 90 and 98 further define tabs 102 and 104 at respective opposite ends. Each of tabs 102 in the overall capacitor body extend to terminal 80, whereas tabs 104 each extend to terminal 82.

Devices 38 and 72 are illustrative of exemplary discrete capacitor components that may be constructed according to the present invention. As will now be described, however, aspects of the present invention are useful in the production of capacitor arrays, i.e., multiple capacitor devices contained within a unitary package. The body containing the capacitor array may have a similar configuration as the embodiments previously discussed. One skilled in the art will also appreciate that such an array will be mounted to a printed circuit in a similar manner.

Figure 10A:
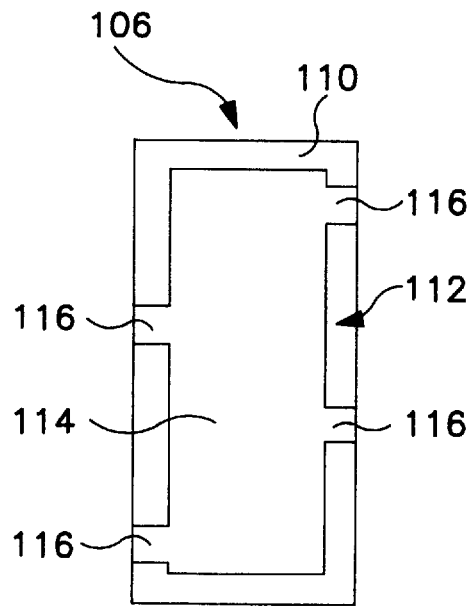
FIGS. 10A and 10B illustrate respective layers as may be stacked in the production of a MLC capacitor array constructed in accordance with the present invention.
Figure 10B:
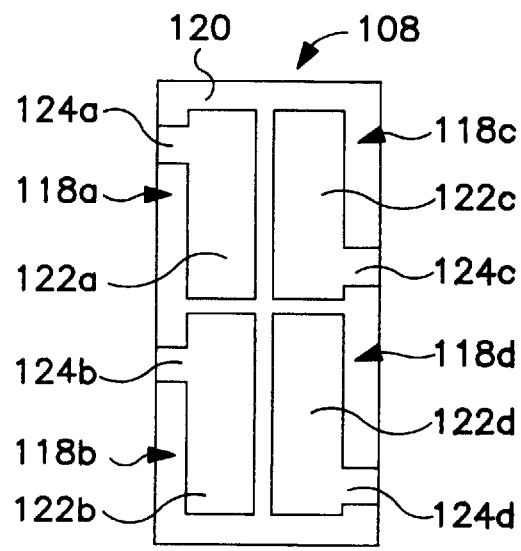

FIGS. 10A and 10B show respective ceramic-electrode layers 106 and 108 that may interleaved in a stack of similar layers to produce a capacitor array having an external appearance indistinguishable from that of device 38. Layer 106 includes a ceramic substrate 110 having a single electrode plate 112 thereon. Plate 112 defines a main electrode portion 114 from which a plurality of tab portions 116 extend.

Layer 108, on the other hand, includes a plurality of electrode plates 118a–d located on ceramic substrate 120. Each of plates 118a–d includes a respective main electrode portion 122a–d, from which a single tab portion 124a–d extends. It will be appreciated that each of plates 118a–d operates in conjunction with opposed plate 114 to yield an individual capacitor. Thus, the overall device will have a number of capacitors equal to the number of such plates 118.

Figure 11A:
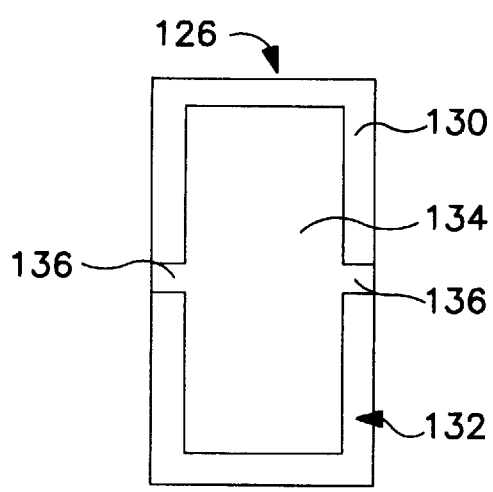
FIGS. 11A and 11B illustrate respective layers as may be stacked in the production of an alternative embodiment of a MLC capacitor array constructed in accordance with the present invention.
Figure 11B:
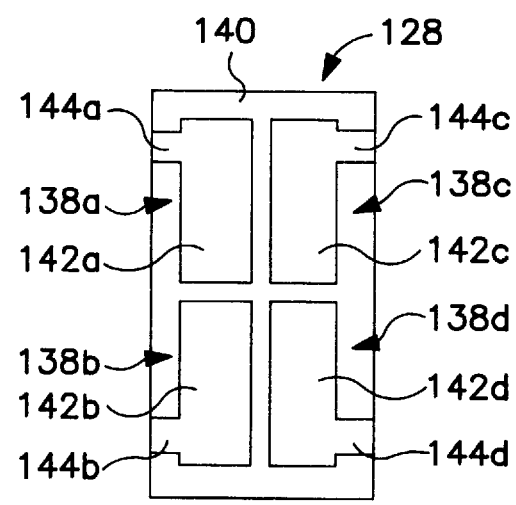

FIGS. 11A and 11B illustrate respective ceramic-electrode layers 126 and 128 as may be utilized in an alternative array structure having a slightly modified "footprint." In particular, the array of this embodiment would have a total of three terminals on each lateral side of the capacitor body. Such an embodiment may be desirable in applications requiring a relatively small package size, such as 0805 or smaller.

In this case, layer 126 includes a ceramic substrate 130 having thereon an electrode plate 132. Plate 132 defines a main electrode portion 134, from which a pair of tab portions 136 extend. It can be seen that the respective tab portions 136 are located directly opposite to one another across main electrode portion 134. Layer 128, on the other hand, includes a plurality of electrode plates 138a–d located on a ceramic substrate 140. Electrode plates 138a–d define a respective main electrode 142a–d from which a single tab portion 144a–d extends.

It can thus be seen that the present invention provides improved capacitor devices that accomplish the various objectives set forth above. While preferred embodiments of the invention have been shown and described, modifications and variations may be made thereto by those of ordinary skill in the art without departing from the spirit and scope of the invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to be limitative of the invention so further described in such appended claims.

What is claimed is:

1. A multilayer capacitor device suitable for use as a surface mount decoupling capacitor, said multilayer capacitor device comprising:
  a low-aspect capacitor body including a plurality of first and second electrode plates interleaved in opposed and spaced apart relation;
  a dielectric material located between each opposing set of said first and second electrode plates to provide a predetermined dielectric constant;
  said first and second electrode plates each including a main electrode portion and at least two spaced apart lead structures extending therefrom, respective lead structures of said first electrode plates being located adjacent respective lead structures of said second electrode plates in an interdigitated arrangement; and at least four electrical terminals located on an outer surface of said capacitor body, corresponding lead structures of said first electrode plates and corresponding lead structures of said second electrode plates being electrically connected together by respective ones of said terminals to define a plurality of electrical terminals of a first polarity and a plurality of electrical terminals of a second polarity, respectively, located on said capacitor body.

2. A multilayer capacitor device as set forth in claim 1, wherein said low-aspect capacitor body has an aspect ratio of no more than 0.5:1.

3. A multilayer capacitor device as set forth in claim 1, wherein said at least four electrical terminals are formed by a thick-film terminal material.

4. A multilayer capacitor device as set forth in claim 1, wherein respective lateral sides of said main electrode portions each have an equal number of said lead structures extending therefrom.

5. A multilayer capacitor device as set forth in claim 4, wherein said main electrode portion of each first electrode plate has a first single lead structure extending from one end side thereof and said main electrode portion of each second electrode plate has a second single lead structure extending therefrom.

6. A multilayer capacitor device as set forth in claim 4, wherein each of said lateral sides has a total of two of said lead structures extending therefrom.

7. A multilayer capacitor device as set forth in claim 4, wherein respective ones of said lead structures extending from one of said lateral sides are offset by one terminal position in relation to respective ones of said lead structures extending from an opposite of said lateral sides.

8. A multilayer capacitor device as set forth in claim 1, wherein said dielectric material located between each opposing set of said first and second electrode plates is a predetermined ceramic dielectric material.

9. A multilayer capacitor device as set forth in claim 8, wherein said capacitor body has a unitary structure characteristic of a plurality of stacked, pressed and sintered ceramic-electrode layers.

10. An electrical circuit arrangement comprising:
  a generally planar circuit board having a plurality of electrical current paths defined thereon; and
  a capacitor device having a capacitor body surface-mounted on said circuit board and having at least four electrical terminals thereon, said terminals being in respective electrical communication with predetermined ones of said current paths, said capacitor body including: (a) at least one first electrode plate having a generally rectangular first main electrode portion with a plurality of first lead structures extending therefrom; (b) at least one second electrode plate situated in opposed and spaced apart relation to said first electrode plate, said second electrode plate having a generally rectangular second main electrode portion with a plurality of second lead structures extending therefrom;
  (c) said electrode plates being situated in a plane substantially parallel to a plane of said circuit board;
  (d) respective ones of said first lead structures being located adjacent respective ones of said second lead structures in an interdigitated arrangement and extending to respective ones of said electrical terminals; and
  (e) a ceramic material located between each opposing set of said first and second electrode plates to provide a predetermined dielectric constant.

11. An electrical circuit arrangement as set forth in claim 10, wherein said electrical terminals are located on at least one lateral side of said capacitor body.

12. An electrical circuit arrangement as set forth in claim 11, wherein said electrical terminals are located on both lateral sides of said capacitor body.

13. An electrical circuit arrangement as set forth in claim 11, wherein said capacitor body further includes first and second testing terminals at each end thereof electrically unconnected to said electrical current paths of said circuit board, said first testing terminal being electrically connected to said first electrode plate and said second testing terminal being electrically connected to said second electrode plate.

14. An electrical circuit arrangement as set forth in claim 10, wherein said capacitor body has an aspect ratio of no more than approximately 1:1.

15. An electrical circuit arrangement as set forth in claim 14, wherein said capacitor body has an aspect ratio of no more than approximately 0.5:1.

16. An electrical circuit arrangement as set forth in claim 10, wherein said electrical terminals are electrically connected to said predetermined ones of said current paths utilizing eutectic solder.

17. An electrical circuit arrangement as set forth in claim 10, wherein each lateral side of said first main electrode portion has an equal number of said first lead structures and each lateral side of said second main electrode portion has an equal number of said second lead structures.

18. An electrical circuit arrangement as set forth in claim 17, wherein:
said first lead structures extending from a first lateral side of said first main electrode portion are offset by one terminal position in relation to said first lead structures extending from a second lateral side of said first main electrode portion; and
said second lead structures extending from a first lateral side of said second main electrode portion are offset by one terminal position in relation to said second lead structures extending from a second lateral side of said second main electrode portion.

19. An electrical circuit arrangement as set forth in claim 18, wherein each lateral side of said first and second main electrode portions has a total of two lead structures extending therefrom.

20. An electrical circuit arrangement as set forth in claim 10, comprising a plurality of said first electrode plates respectively interleaved with a plurality of said second electrode plates.

21. A multilayer ceramic capacitor comprising:
a low-aspect capacitor body having a unitary structure characteristic of a plurality of stacked, pressed and sintered ceramic-electrode layers;
said capacitor body including a plurality of first polarity electrical terminals and a plurality of second polarity electrical terminals located on the outer surface thereof, said plurality of electrical terminals being formed by a thick-film terminal material;
each ceramic-electrode layer including an electrode plate having a main electrode portion with a plurality of lead structures extending therefrom, said electrode plates being interleaved such that 15 respective lead structures of first alternating electrode plates are electrically connected to respective first polarity terminals and respective lead structures of second alternating electrode plates are electrically connected to respective second polarity terminals; and
wherein said capacitor is constructed and arranged to exhibit an inductance of less than approximately 100 picohenries.

22. A multilayer ceramic capacitor as set forth in claim 21, wherein said low-aspect capacitor body has an aspect ratio of no more than 0.5:1.

23. A multilayer ceramic capacitor as set forth in claim 21, wherein said respective lead structures of said first alternating electrode plates are located adjacent said respective lead structures of said second alternating electrode plates in an interdigitated arrangement.

24. A multilayer ceramic capacitor as set forth in claim 23, wherein:
said capacitor body has a generally rectangular configuration defining lateral sides of greater dimension and end sides of lesser dimension; and
respective ones of said lateral sides each have an equal number of said first polarity terminals and said second polarity terminals.

25. A multilayer ceramic capacitor as set forth in claim 23, wherein each of said lateral sides has two of said first polarity terminals and two of said second polarity terminals.

26. A multilayer ceramic capacitor as set forth in claim 25, wherein a centerline spacing between a respective first polarity terminal and an adjacent second polarity terminal is no greater than approximately 0.03 inches.

27. A multilayer ceramic capacitor as set forth in claim 25, wherein:
respective said first polarity terminals on a first lateral side of said capacitor body are offset by one terminal position in relation to respective first polarity terminals located on a second lateral side of said capacitor body; and
respective said second polarity terminals on said first lateral side are offset by one terminal position in relation to respective said second polarity terminals located on said second lateral side.

28. A capacitor array having a plurality of capacitor devices in a surface mount compatible package, said array comprising:
a capacitor body having a unitary structure characteristic of a plurality of stacked, pressed and sintered ceramic-electrode layers, said ceramic electrode layers comprising a plurality of first ceramic-electrode layers and a plurality of second ceramic-electrode layers; said capacitor body including a plurality of first polarity electrical terminals and a plurality of second polarity electrical terminals located on the outer surface thereof;
said first ceramic-electrode layers including an electrode plate having a first main electrode portion with a plurality of first lead structures extending therefrom;
said second ceramic-electrode layers including at least four coplanar second electrode plates situated in opposed and spaced apart relation to said first electrode plate, said second electrode plates each having a second main electrode portion with at least one second lead structure extending therefrom;
respective ones of said first lead structures being located adjacent respective ones of said second lead structures in an interdigitated arrangement and extending to respective ones of said electrical terminals;
wherein said capacitor array has a number of capacitor devices equal to a number of said second electrode plates.

29. A capacitor array as set forth in claim 28, wherein each of said first main electrode portions has at least two of said first lead structures extending therefrom.

30. A capacitor array as set forth in claim 29, wherein each of said first main electrode portions has at least four of said first lead structures extending therefrom.

* * * * *

UNITED STATES PATENT AND TRADEMARK OFFICE
CERTIFICATE OF CORRECTION

PATENT NO. : 5,880,925

DATED : March 9, 1999

INVENTOR(S) : David A. DuPre, et al

It is certified that error appears in the above-identified patent and that said Letters Patent is hereby corrected as shown below:

Delete Drawing Figures 8, 9A and 9B and substitute with the figures below:

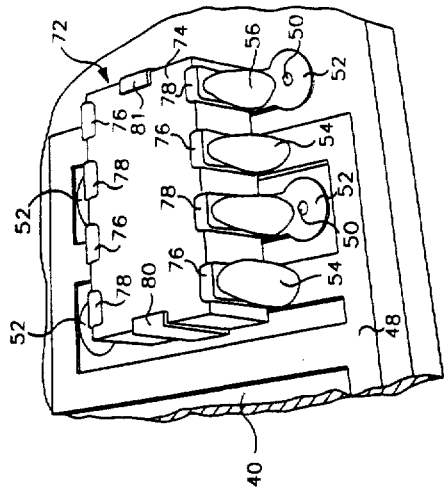

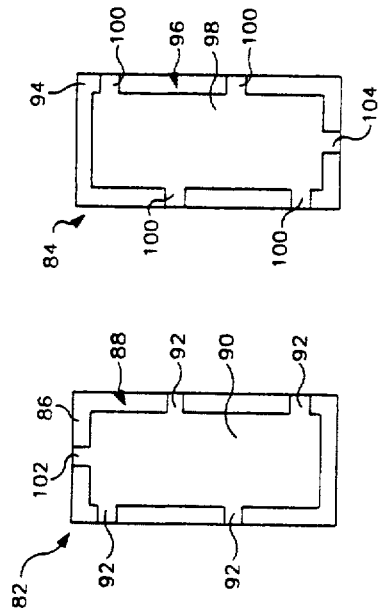

Signed and Sealed this

Twenty-second Day of May, 2001

Attest:

NICHOLAS P. GODICI

Attesting Officer

Acting Director of the United States Patent and Trademark Office